(12) United States Patent
Matsui

(10) Patent No.: US 8,378,235 B2
(45) Date of Patent: Feb. 19, 2013

(54) ELECTRIC JUNCTION BOX

(75) Inventor: Toshiyuki Matsui, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 349 days.

(21) Appl. No.: 12/878,410

(22) Filed: Sep. 9, 2010

(65) Prior Publication Data

US 2011/0100705 A1 May 5, 2011

(30) Foreign Application Priority Data

Nov. 5, 2009  (JP) ................................. 2009-254454

(51) Int. Cl.
*H05K 7/02* (2006.01)
(52) U.S. Cl. ....................................... 174/541; 439/76.2
(58) Field of Classification Search .................. 174/535, 174/541; 439/76.2
See application file for complete search history.

(56) References Cited

U.S. PATENT DOCUMENTS

| | | | | |
|---|---|---|---|---|
| 4,555,638 A * | 11/1985 | Lobe | ............................ | 307/10.1 |
| 4,685,753 A * | 8/1987 | Isshiki et al. | ..................... | 439/74 |
| 4,689,718 A * | 8/1987 | Maue et al. | .................... | 361/736 |
| 4,703,397 A * | 10/1987 | Minoura et al. | .............. | 361/826 |
| 4,850,884 A * | 7/1989 | Sawai et al. | ................... | 439/76.2 |
| 5,362,242 A | 11/1994 | Nakamura | | |
| 5,707,243 A * | 1/1998 | Endo et al. | ..................... | 439/76.2 |
| 6,404,628 B1 * | 6/2002 | Nagashima et al. | .......... | 361/690 |
| 6,712,623 B2 * | 3/2004 | Sumida | ......................... | 439/76.2 |
| 6,808,379 B2 * | 10/2004 | Yoo | ............................... | 425/100 |
| 6,997,721 B2 | 2/2006 | Shirota | | |
| 7,153,145 B2 | 12/2006 | Sekido | | |
| 7,168,962 B2 | 1/2007 | Yomura | | |
| 7,381,065 B2 * | 6/2008 | Ikeda et al. | ................... | 439/76.2 |

FOREIGN PATENT DOCUMENTS

| | | |
|---|---|---|
| JP | 8-78076 | 3/1996 |
| JP | 10-257643 | 9/1998 |
| JP | 10-322855 | 12/1998 |
| JP | 2001-45630 | 2/2001 |
| JP | 2005-253158 | 9/2005 |

OTHER PUBLICATIONS

U.S. Appl. No. 12/888,597 to Toshiyuki Matsui, filed Sep. 23, 2010.

* cited by examiner

*Primary Examiner* — Hung Ngo
(74) *Attorney, Agent, or Firm* — Greenblum & Bernstein P.L.C.

(57) ABSTRACT

Vertical bus bars are mounted on a first surface of a box main body. A connection terminal of the vertical bus bars projects inside a fitting peripheral wall of a connector fitting portion provided to a second surface of the box main body. A retainer is provided off of the electrical component connection portion, the retainer holding the vertical bus bars disengageably from the first surface.

8 Claims, 9 Drawing Sheets

ELECTRIC JUNCTION BOX

CROSS-REFERENCE TO RELATED APPLICATIONS

The present application claims priority under 35 U.S.C. §119 of Japanese Application No. 2009-254454, filed on Nov. 5, 2009, which is herein expressly incorporated by reference in its entirety.

BACKGROUND OF THE INVENTION

1. Field of the Invention

The present invention relates to an electric junction box mounted to a vehicle and the like, particularly relates to an electric junction box provided with an electrical component mount portion and a bus bar for conduction with the electrical component mount portion.

2. Description of Related Art

Electric junction boxes, such as relay boxes, fuse boxes, and the like, are conventionally used in vehicles and the like, in order to improve efficiency of electric wiring and maintenance performance. Electrical components, such as relays, fuses, and the like, and conducting members, such as bus bars and the like, are appropriately mounted to a box main body of an electric junction box. Electric power from a battery and the like is thus supplied to vehicle electrical components.

An electric junction box to which a relatively large electric current is supplied, such as a relay box and the like provided proximate to a battery, has a relatively wide bus bar as a conducting member. In order to mount a wide bus bar while preventing enlargement of the electric junction box, a vertical bus bar is conventionally employed, the vertical bus bar being housed perpendicular to a first surface (front surface) of a box main body to which a mount portion for electrical components, such as a relay and a fuse, is provided. Such a vertical bus bar is disclosed in Japanese Patent Laid-open Publication No. H10-322855, for instance. To the vertical bus bar, an electrical component mounted to the electrical component mount portion is connected to a connection portion provided to a first end edge portion in a width direction, and an external connector terminal is connected to a connection portion provided to a second end edge portion, the external connector terminal being housed in a connector fitting peripheral wall provided open to a second surface (rear surface) of the box main body.

In order to employ the vertical bus bar and to connect the electrical component and an external wire, however, it is required to provide a cut-out to a peripheral wall of a connector housing portion open to the second surface (rear surface) of the box main body, and then to insert the vertical bus bar through the cut-out and mount it to the box main body. Thus, the peripheral wall of the connector housing portion is separated by the cut-out in a circumferential direction, and the peripheral wall is easily spread out by the connector. Thus, fitting stability of the connector is deteriorated, and dustproof and waterproof performance of the peripheral wall is also deteriorated.

Japanese Patent Laid-open Publication No. H10-322855 also proposes that the peripheral wall of the connector housing portion is enclosed by a holding member from outside, and thereby the peripheral wall is prevented from being spread out. When the holding member is provided, however, it increases the number of components and assembly processes. In addition, the peripheral wall to which the connector directly contacts remains separated, and then a gap might be caused between the peripheral wall and the holding member depending on dimension accuracy of the peripheral wall and the holding member, thus putting a limit to effect of strength improvement and ensuring of fitting stability.

SUMMARY OF THE INVENTION

In view of the above, the present invention provides an electric junction box having a new structure capable of further improving strength and fitting stability of a connector housing portion, while maintaining connector connection between an electrical component and an external electric wire by a vertical bus bar.

A first aspect of the present invention provides an electric junction box in which an electrical component is mounted to a first surface of a box main body and a connector fitting portion is provided inside a fitting peripheral wall open to a second surface of the box main body, the connector fitting portion having a projecting connection terminal formed of a vertical bus bar. In the electric junction box, the vertical bus bar is mounted to the first surface of the box main body; the connection terminal integrally provided to the vertical bus bar penetrates the box main body and projects inside the fitting peripheral wall; an electrical component connection portion is integrally provided to the vertical bus bar on the first surface of the box main body, and a retainer is provided holding the vertical bus bar disengageably from the first surface of the box main body in a position off of the electrical component connection portion.

According to the present invention, the vertical bus bar is inserted from a side of the electric junction box opposite to a side to which the connector fitting portion is provided. Thus, it is unnecessary to provide a cut-out to the fitting peripheral wall of the connector fitting portion in order to insert the vertical bus bar. As a result, the fitting peripheral wall of the connector fitting portion can be continuously provided along the entire periphery. Thereby, fitting stability of a connector can be enhanced since the strength of the fitting peripheral wall is maintained.

Even an SRS connector and the like that requires particularly high fitting stability can be connected to the electric junction box, for example, while a large amount of electric transmission can be stably achieved by the vertical bus bar. Further, providing the fitting peripheral wall continuously along the entire periphery also improves waterproof effect. Thereby, a waterproof function can be eliminated from or simplified in the connector itself connected to the connector fitting portion, and thus a structure of the connector can be simplified.

Further, the vertical bus bar can be prevented from being disengaged and be stably held by the retainer. Thereby, the connection terminal provided to the vertical bus bar can be held in a stably positioned state in the fitting peripheral wall, and thus the connector can be connected in a further easy and stable manner. Particularly, since the electrical component connection portion can be held in a position off thereof without being restrained, a contact pressure intended by the electric component connection portion can be advantageously ensured.

A second aspect of the present invention provides the electric junction box according to the first aspect, in which a bus bar insertion groove is provided open to the first surface of the box main body; the vertical bus bar is inserted and assembled to the bus bar insertion groove; a tapered surface widening externally is provided to an opening portion of both walls constituting the bus bar insertion groove; the opening portion of the both walls constituting the bus bar insertion groove is closed by the retainer; and a pressing projection is provided to the retainer, the pressing projection entering the bus bar insertion groove from the tapered surface in the opening portion, and overlapping an end surface of the vertical bus bar.

According to the present aspect, inserting the vertical bus bar to the bus bar insertion groove prevents lateral instability of the vertical bus bar. In addition, the pressing projection provided to the retainer prevents longitudinal instability of the vertical bus bar. Thereby, a positioning and holding force of the vertical bus bar can be improved, and thus alignment accuracy of the connection terminal and the electrical component connection portion can be enhanced.

In particular, providing the tapered surface to the opening portion of the both walls constituting the bus bar insertion groove allows the vertical bus bar to be more easily inserted between the both walls. Since the pressing projection of the retainer enters the bus bar insertion groove from the tapered surface and presses the vertical bus bar, the vertical bus bar can easily be inserted and effectively be prevented from being unstable in the bus bar insertion groove.

A third aspect of the present invention provides the electric junction box according to the first or second aspect, in which a window for mounting the electrical component is provided to the retainer; and the electrical component connection portion is positioned in the window for mounting.

According to the present embodiment, the electrical component mount portion can be provided effectively in terms of space, by using the window for mounting of the retainer. Further, the retainer holds the vertical bus bar in a position off of the electric component connection portion. Thus, the electric component connection portion may have a pronged shape, for instance. The electric component connection portion may be provided in the window for mounting in a state in which a surrounding clearance is ensured, and thus a contact pressure intended by the electric component connection portion can advantageously be ensured. Furthermore, since the electric component connection portion is integrally provided to the vertical bus bar, a height position of the electric component connection portion in the window for mounting can be set only by changing the shape of the vertical bus bar, thus high flexibility can be obtained in designing and adjustment flexibility in the vertical alignment is enhanced for the electric component connection portion.

A fourth aspect of the present invention provides the electric junction box according to one of the first to third aspects, in which a contact portion to the retainer is provided to the vertical bus bar on a side opposite to the connector terminal in a vertical direction of the vertical bus bar, the contact portion preventing displacement in a disengagement direction from the box main body.

According to the present invention, a holding force of the retainer provided by the contact portion can further effectively be exerted on the vertical bus bar, relative to an external force exerted on the vertical bus bar when a connector is connected to the connection terminal. Thereby, instability of the vertical bus bar in connector connection can further effectively be prevented, and thus connector connection work can be performed more smoothly.

According to the present invention, the vertical bus bar is mounted to the electric junction box from the side opposite to the connector fitting portion. Thus, the fitting peripheral wall of the connector fitting portion can continuously be provided along the entire periphery, and thereby the connector fitting stability can be improved.

BRIEF DESCRIPTION OF THE DRAWINGS

The present invention is further described in the detailed description which follows, with reference to the noted plurality of drawings by way of non-limiting examples of exemplary embodiments of the present invention, in which like reference numerals represent similar parts throughout the several views of the drawings, and wherein.

DETAILED DESCRIPTION OF PREFERRED EMBODIMENTS

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description is taken with the drawings making apparent to those skilled in the art how the forms of the present invention may be embodied in practice.

The embodiments of the present invention are explained below with reference to the drawings.

Figure 1:
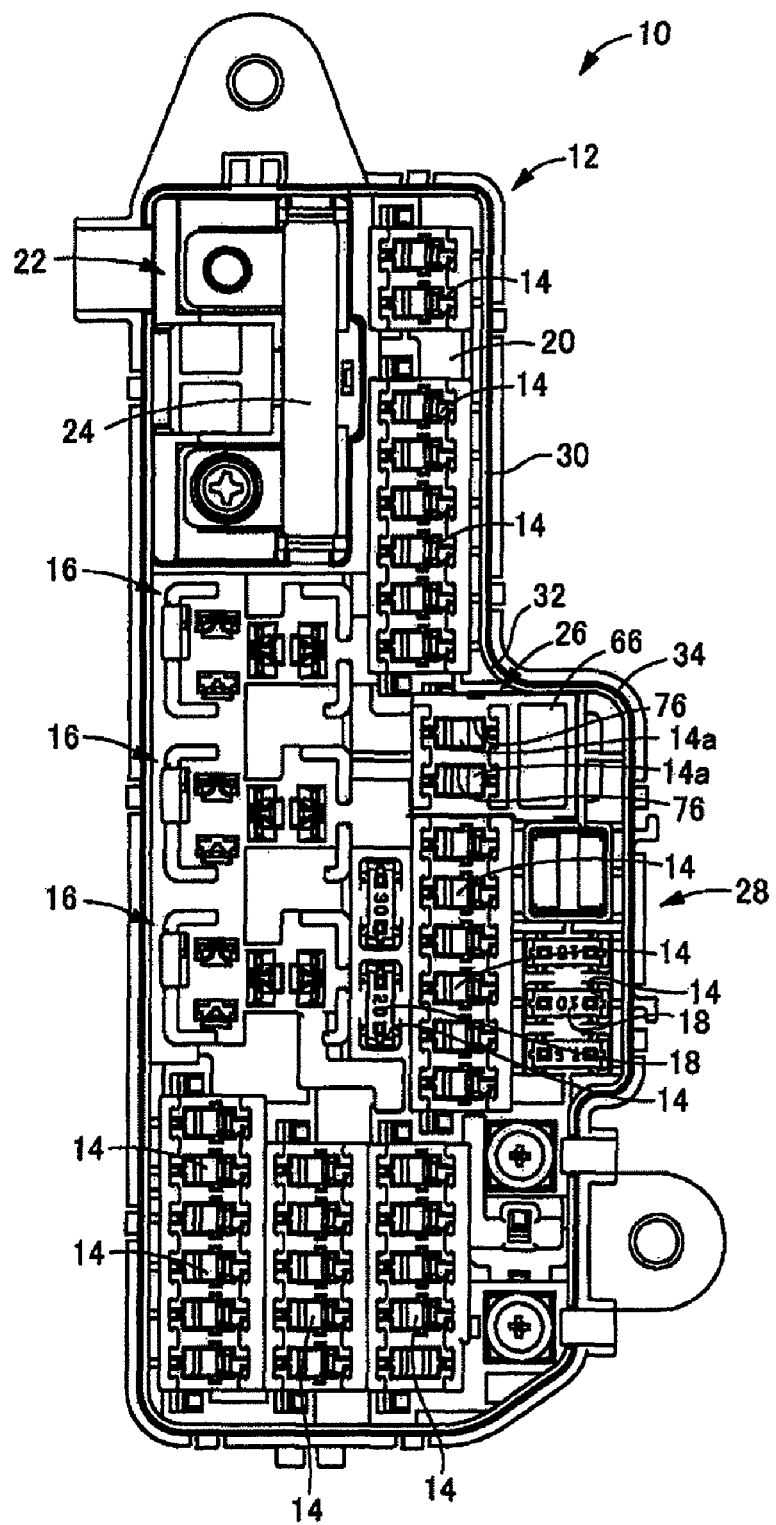
FIG. 1 is a front view of an electric junction box according to an embodiment of the present invention.

An electric junction box 10 is first shown in FIG. 1, as an embodiment of the present invention. The electric junction box 10 according to the present embodiment may be mounted to any suitable vehicle, such as a motorcycle, and has a longitudinal box main body 12 formed of any suitable material, such as synthetic resin. The box main body 12 is provided with a plurality of fuse attachment portions 14 and relay attachment portions 16, which are linearly aligned in a longitudinal direction. Fuses 18 and relays (not shown in the drawing) as electrical components are mounted respectively from a front surface 20 side as a first surface of the box main body 12. A fusible link attachment portion 22 is provided to a first longitudinal end portion of the box main body 12, and a multi-fusible link 24 as an electrical component is fixed in any suitable manner, such as by a bolt.

Further, a connector connection portion 26 is provided to substantially a longitudinal middle portion of the box main body 12. Specifically, a projected portion 28 projecting external to the box main body 12 is provided to substantially a longitudinal intermediate portion of the box main body 12. A portion of the connector connection portion 26 is provided to the projected portion 28 in an end portion located on a central side of the box main body 12 (upper end portion in FIG. 1). An external peripheral wall 30 of the box main body 12 has a curved shape extending substantially a quarter of a circumference in a projected base end portion 32 and a projected front end portion 34 of the projected portion 28.

Figure 2:
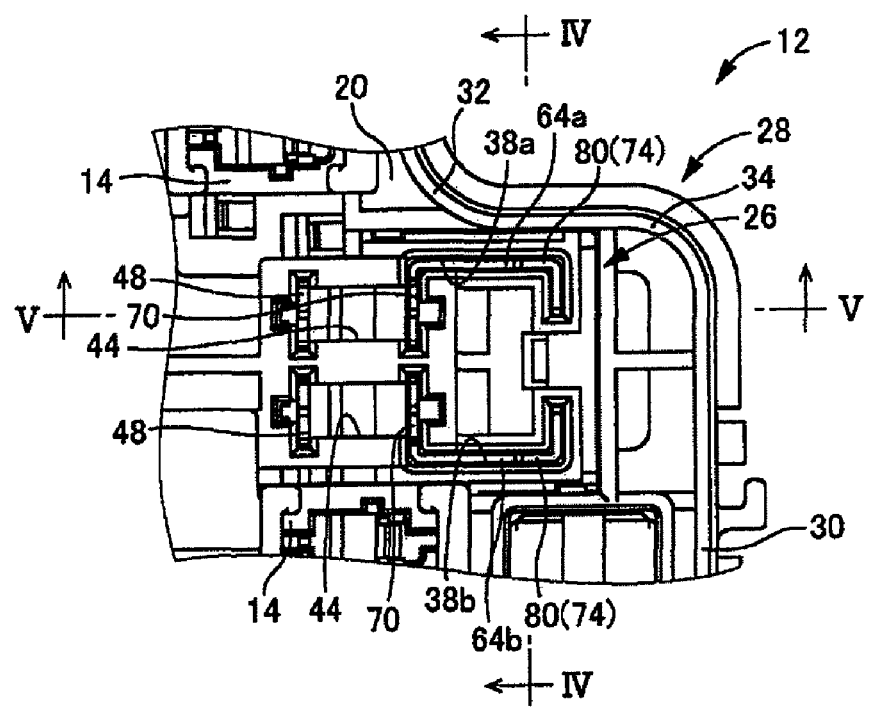
FIG. 2 is a front view of a connector connection portion provided to the electric junction box shown in FIG. 1.
Figure 3:
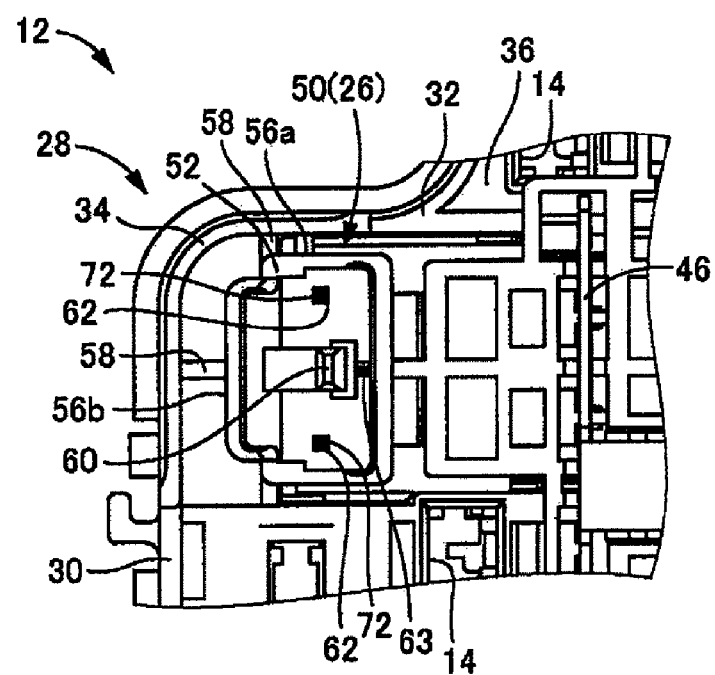
FIG. 3 is a rear view of the connector connection portion shown in FIG. 2.
Figure 4:
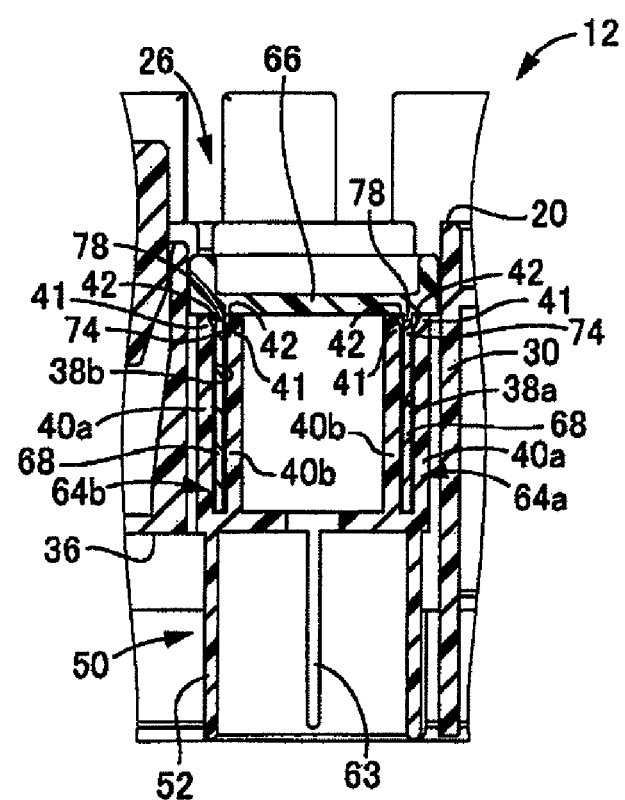
FIG. 4 is a cross-sectional view of the connector connection portion shown in FIG. 2 along IV-IV.
Figure 5:
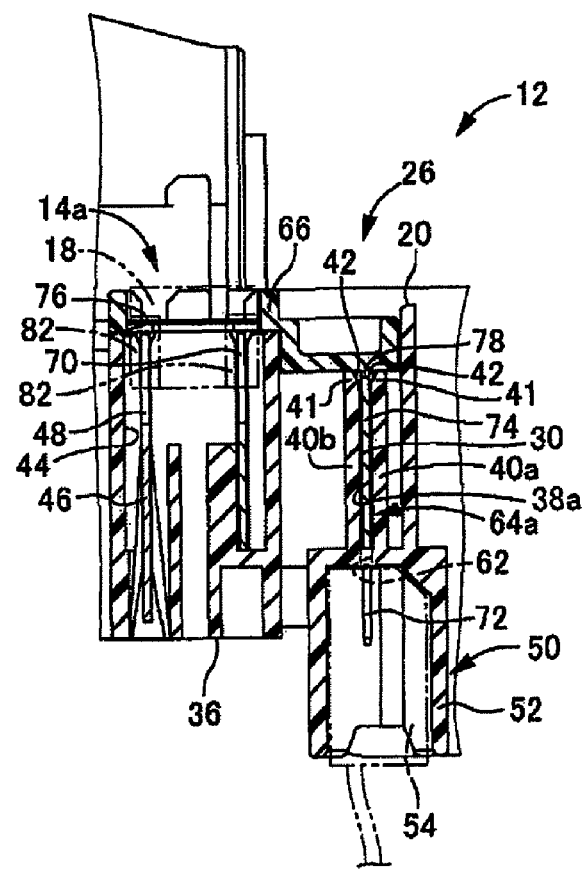
FIG. 5 is a cross-sectional view of the connector connection portion shown in FIG. 2 along V-V.

The front surface 20 side of the connector connection portion 26 is shown in FIG. 2. A rear surface 36 side opposite to the front surface 20 is shown in FIG. 3, as a second surface of the box main body 12. FIG. 2 illustrates a state in which a retainer 66 hereinafter described is removed. The connector connection portion 26 is provided with a pair of bus bar insertion grooves 38a and 38b open on the front surface 20. Each of the bus bar insertion grooves 38a and 38b is substantially a bottomed slit having a substantially square C-shape open to the front surface 20 side. The bus bar insertion grooves 38a and 38b are provided having square C-shaped openings directed toward each other. As shown in FIGS. 4 and 5, tapered surfaces 42 are provided to an opening portion 41 of wall portions 40a and 40b, which constitute each of the bus bar insertion grooves 38a and 38b, the tapered surfaces 42 widening toward the front surface 20 side. A groove width of the bus bar insertion grooves 38a and 38b in the present embodiment is slightly greater than a thickness of vertical bus bars 64a and 64b hereinafter described. Thus, the vertical bus bars 64a and 64b are inserted to the bus bar insertion grooves 38a and 38b, respectively, without being pressed. The groove width of the vertical bus bars 64a and 64b may be adjusted, however, so as to be press fitted.

Figure 6:
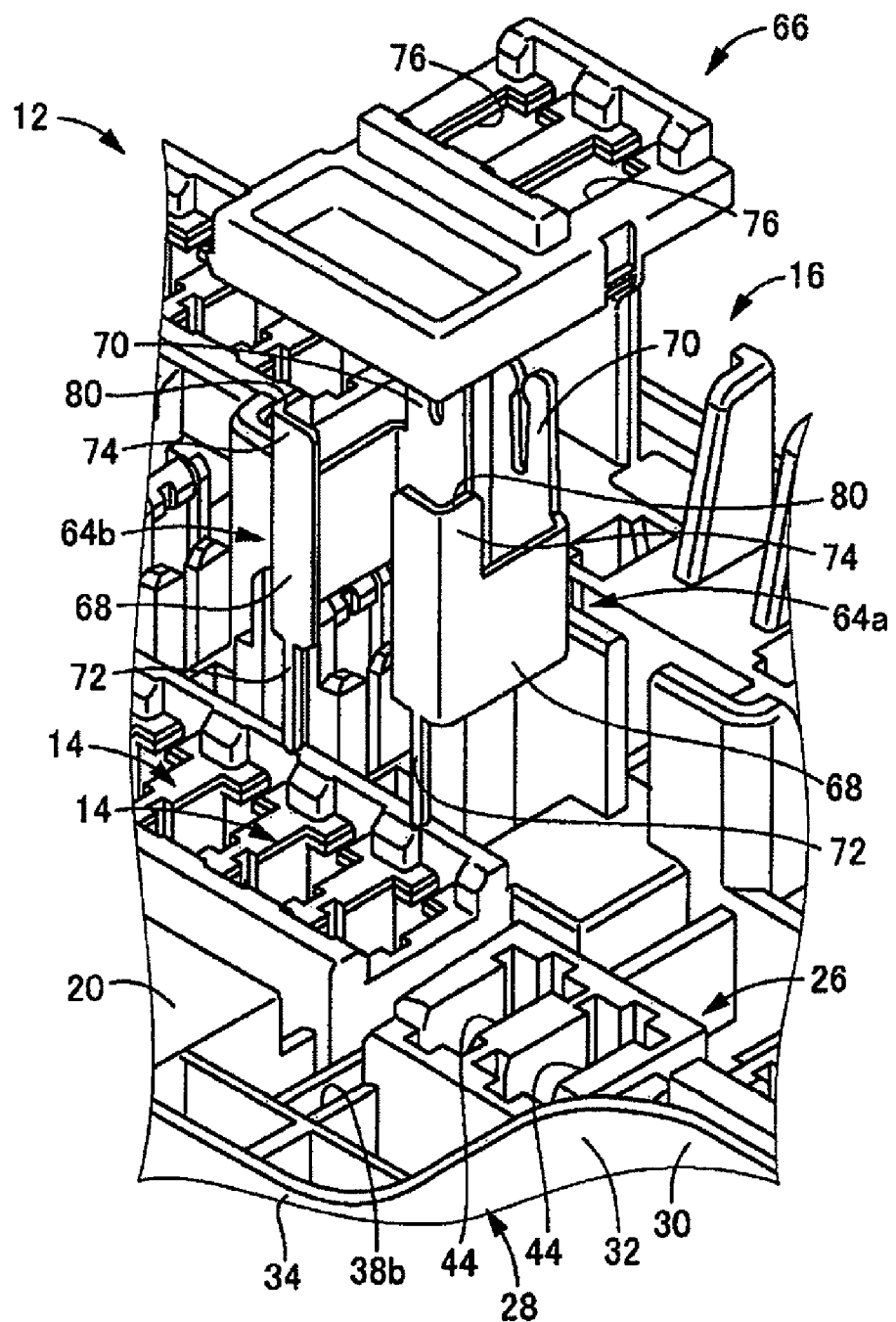
FIG. 6 is an exploded perspective view of the connector connection portion shown in FIG. 2.

As shown in FIG. 2, the connector connection portion 26 is provided with a component insertion hole 44 having substantially a longitudinal rectangular shape and being open on the front surface 20. The component insertion hole 44 is provided to each of the bus bar insertion grooves 38a and 38b. The component insertion holes 44 are provided adjacently orthogonal to the opening direction of the square C shape (vertical direction in FIG. 2) of the bus bar insertion grooves 38a and 38b. A first external side surface of each of the bus bar insertion grooves 38a and 38b is open to a first longitudinal end portion of the component insertion hole 44. In other words, as shown in FIG. 6 hereinafter described, the component insertion hole 44 has a shape of the known fuse attachment portion 14 from which an opening side end portion thereof is cut off orthogonal to the opening direction and removed, the fuse attachment portion 14 being provided adjacently to the connector connection portion 26. Then, each of the bus bar insertion grooves 38a and 38b is connected to the first longitudinal end portion of the component insertion hole 44.

A pronged electrical component connection portion 48 is provided to a second longitudinal end portion of the component insertion hole 44 opposite to the bus bar insertion grooves 38a and 38b, the electrical component connection portion 48 being formed on a vertical bus bar 46 which is inserted and fixed from the rear surface 36 of the electric junction box 10.

As shown in FIG. 3, a connector fitting portion 50 is provided to the rear surface 36 side of the connector connection portion 26. The connector fitting portion 50 has a fitting peripheral wall 52 open to the rear surface 36. The fitting peripheral wall 52, which projects from the electric junction box 10 to the rear surface 36 side, is a peripheral wall continuously provided along an entire periphery. Particularly in the present embodiment, an SRS connector 54 (refer to FIG. 5) is mounted to the connector fitting portion 50, and thus the fitting peripheral wall 52 surrounds the entire periphery along the SRS connector 54.

In the fitting peripheral wall 52, external surfaces 56a and 56b facing the external peripheral wall 30 of the electric junction box 10 are connected to the external peripheral wall 30 by a reinforcing rib 58, and thus the strength of the fitting peripheral wall 52 is increased. As shown in FIG. 3, an engagement piece 60 is provided to substantially a middle portion inside the fitting peripheral wall 52, the engagement piece 60 projecting in a same direction as the fitting peripheral wall 52. The engagement piece 60 locks the SRS connector 54. Terminal insertion holes 62 are provided open to both sides sandwiching the engagement piece 60 inside the fitting peripheral wall 52, the terminal insertion holes 62 penetrating the front and back of the electric junction box 10 and connecting to the bus bar insertion grooves 38a and 38b. Further, as shown in FIG. 4, a guide rib 63 is provided to an internal surface of the fitting peripheral wall 52, the guide rib 63 extending in a projection direction of the fitting peripheral wall 52. The guide rib 63 positions and guides the SRS connector 54 in an insertion and removal direction.

Figure 7:
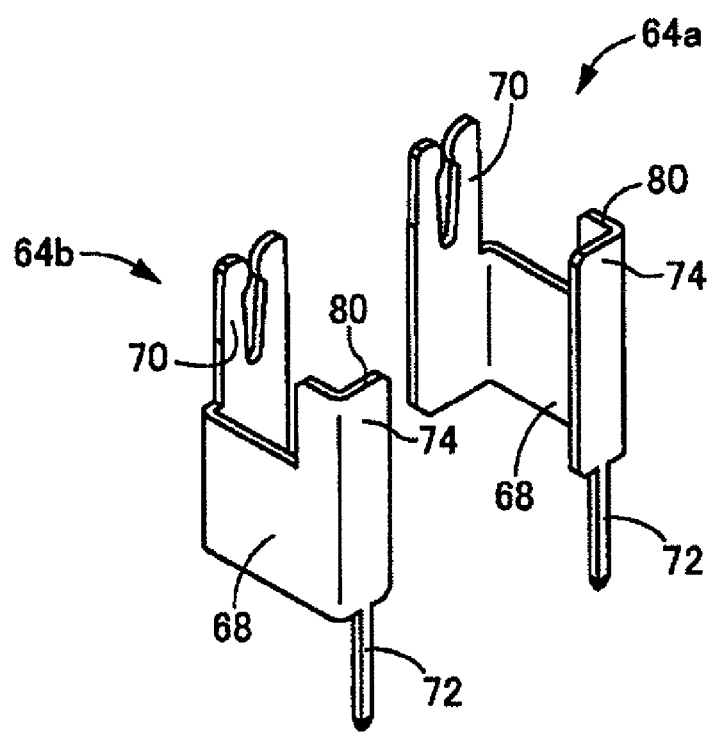
FIG. 7 is a perspective view of a vertical bus bar provided to the connector connection portion shown in FIG. 2.

As shown in FIG. 6, the vertical bus bars 64a and 64b are inserted to the bus bar insertion grooves 38a and 38b, respectively, of the connector connection portion 26 having the structure above, and then covered by the retainer 66. The vertical bus bars 64a and 64b are shown in FIG. 7. Since the vertical bus bars 64a and 64b have a symmetrical shape, the vertical bus bar 64a is explained below as an example.

The vertical bus bar 64a is integrally formed of a bent conductive metal plate, and is provided with a main body portion 68 having a square C shape. A pronged electrical component connection portion 70 is integrally provided to a first end portion of the main body portion 68, the electrical component connection portion 70 projecting to the front surface 20 side (upward in FIG. 7) when being housed in the bus bar insertion groove 38a. Further, a pin-shaped connection terminal 72 is integrally provided to an end portion opposite to the electrical component connection portion 70 of the main body portion 68, the connection terminal 72 projecting in a direction opposite to the electrical component connection portion 70. A contact portion 74 is integrally provided to a side opposite to the connection terminal 72 in a vertical direction (vertical direction in FIG. 7) of the vertical bus bar 64a, the contact portion 74 projecting in a same direction as the electrical component connection portion 70. The contact portion 74 is provided to a bent portion of the main body portion 68 and projects from the main body portion 68 having an L-shaped cross section.

Figure 8:
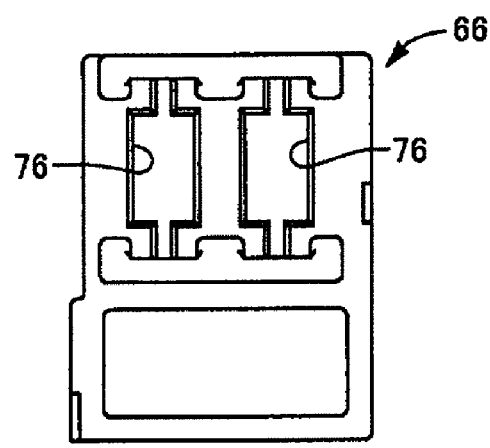
FIG. 8 is a front view of a retainer provided to the connector connection portion shown in FIG. 2.

The retainer 66 has substantially a rectangular planar shape formed of any suitable material, such as synthetic resin having a predetermined thickness, as shown in FIG. 8. The retainer 66 is placed over the connector connection portion 26 from the front surface 20. A pair of windows for mounting 76 penetrate positions overlapping the compartment insertion holes 44 provided to the connector connection portion 26. The windows for mounting 76 have a shape same as the opening portion of the fuse attachment portion 14.

As shown in FIG. 6, the vertical bus bars 64a and 64b are inserted from the front surface 20 to the bus bar insertion grooves 38a and 38b, respectively, of the connector connection portion 26. Then, the retainer 66 is placed over the connector connection portion 26 from the front surface 20. Although not shown in the drawing, the retainer 66 is fixed in any suitable manner, such as by using an engagement mechanism, a glue, and the like, in a state in which the retainer 66 is placed over the connector connection portion 26.

Thereby, the vertical bus bars 64a and 64b are housed in and assembled to the bus bar insertion grooves 38a and 38b, respectively, as shown in FIGS. 4 and 5. The connection terminals 72 of the vertical bus bars 64a and 64b penetrate the box main body 12 through the terminal insertion holes 62, and project inside the fitting peripheral wall 52. Further, the windows for mounting 76 of the retainer 66 overlap the component insertion holes 44 of the connector connection portion 26, and thus a fuse cavity is provided. Then, the electrical component connection portions 70 of the vertical bus bars 64a and 64b are positioned in the windows for mounting 76, and provided on an end portion opposite to the electric component connection portion 48 of the vertical bus bar 46 in the longitudinal direction of the component insertion holes 44. Thereby, a pair of fuse attachment portions 14a are provided to the connector connection portion 26.

Further, the opening portions 41 of the bus bar insertion grooves 38a and 38b are covered by the retainer 66. Then, the contact portions 74 of the vertical bus bars 64a and 64b housed in the bus bar insertion grooves 38a and 38b, respectively, contact the retainer 66. Thereby, the vertical bus bars 64a and 64b are prevented from being displaced from the bus bar insertion grooves 38a and 38b, respectively, in a disengagement direction (upward in FIGS. 4 and 5), and thus the vertical bus bars 64a and 64b are held in the bus bar insertion grooves 38a and 38b, respectively, while being prevented from being disengaged toward the front surface 20 side. A small space is provided between the electrical component connection portions 70 of the vertical bus bars 64a and 64b and the retainer 66, and thus the electrical component connection portions 70 are not in contact with the retainer 66.

Particularly in the present embodiment, a rib-shaped pressing projection 78 is integrally provided to the retainer 66. When the bus bar insertion grooves 38a and 38b are covered, the pressing projection 78 enters the bus bar insertion grooves 38a and 38b through a space between the tapered surfaces 42 in the opening portions 41, and then overlaps projected end surfaces 80 of the contact portions 74 of the vertical bus bars 64a and 64b. Thereby, the vertical bus bars 64a and 64b are disengageably held in the bus bar insertion grooves 38a and 38b, respectively.

As shown in FIG. 5, the SRS connector 54 is inserted in the fitting peripheral wall 52 of the connector connection portion 50 provided to the rear surface 36 of the connector connection portion 26 having the structure above, and then connected to the connection terminal 72 projecting inside the fitting peripheral wall 52. Meanwhile, the fuses 18 are respectively mounted to the fuse attachment portions 14a provided to the front surface 20. Then, a pair of terminals 82 of each of the fuses 18 are connected to the electrical component connection portion 48 of the vertical bus bar 46 and the electrical component connection portion 70 of the vertical bus bars 64a and 64b, which are provided in the fuse attachment portion 14a. Thereby, the SRS connector 54 is electrically connected to the fuses 18 through the vertical bus bars 64a and 64b.

According to the present embodiment, the bus bar insertion grooves 38a and 38b are provided open on the front surface 20 side of the box main body 12, and the vertical bus bars 64a and 64b are inserted from the front surface 20. It is thus unnecessary to provide the bus bar insertion grooves 38a and 38b open on the rear surface 36 side of the box main body 12. Thereby, the fitting peripheral wall 52 provided to the rear surface 36 can be provided continuously along an entire periphery without being separated by the bus bar insertion grooves. As a result, the strength of the fitting peripheral wall 52 is improved, and the fitting stability of the SRS connector 54 can be enhanced since the connector is enclosed along its entire periphery. Particularly in the present embodiment, the projected portion 28 is provided to the box main body 12 in the longitudinal middle portion, in which warped deformation tends to occur, thus preventing a warp in the longitudinal middle portion of the box main body 12. Since the fitting peripheral wall 52 is provided to a corner portion of the projected portion 28, the fitting peripheral portion 52 is prevented from being deformed due to a warp of the box main body 12.

In accordance with improvement in the connector fitting stability, even the SRS connector 54 that requires high fitting stability can be connected to the connector fitting portion 50 provided to the electric junction box 10. Compared with a case in which the SRS connector 54 is connected outside the electric junction box 10, a structure of the SRS connector 54 itself can thus be simplified, since, for example, a waterproof connector is no longer required. Since the SRS connector 54 is enclosed by the fitting peripheral wall 52 along the entire periphery, further excellent waterproof effect can be achieved.

The vertical bus bars 64a and 64b are sandwiched by the both wall portions 40a and 40b of the bus bar insertion grooves 38a and 38b, and thus lateral instability is reduced. Further, the vertical bus bars 64a and 64b are pressed by the retainer 66, and thus longitudinal instability is reduced. Thereby, the vertical bus bars 64a and 64b are stably held in the bus bar insertion grooves 38a and 38b, respectively, and thus excellent terminal alignment accuracy can be achieved. Particularly in the present embodiment, the opening portions 41 of the bus bar insertion grooves 38a and 38b are widened by the tapered surfaces 42, and thus insertion of the vertical bus bars 64a and 64b is easy. Further, the pressing projection 78 of the retainer 66 enters the widened opening portions 41 and presses the vertical bus bars 64a and 64b. Thus, instability of the vertical bus bars 64a and 64b is effectively reduced in the widened opening portions 41.

In addition, the retainer 66 is contacted by the contact portions 74 of the vertical bus bars 64a and 64b, and thus does not contact with the electrical component connection portions 70. Thereby, the pronged electrical component connection portion 70 are prevented from being restrained by the retainer 66, and thus a contact pressure can be set accurately when the fuse 18 is inserted. Further, adjusting a projection dimension of the electrical component connection portion 70 from the main body portion 68 can easily adjust vertical alignment of the electrical component connection portion 70.

Since the contact portions 74 project to the side opposite to the connection terminals 72 to which the SRS connector 54 is connected, a holding force of the retainer 66 is further effectively exerted on the vertical bus bars 64a and 64b relative to an external force when the SRS connector 54 is fitted. Further, adjusting a projection dimension of the contact portion 74 from the main body portion 68 can adjust vertical alignment of the vertical bus bars 64a and 64b.

The embodiment of the prevent invention is explained in detail above. The present invention, however, is not limited by specifics in the explanation. For instance, the number of connector connection portions and the number of bus bar insertion grooves provided thereto are by no means limited to those shown, but rather any suitable number may be provided. Thus, a plurality of connector connection portions may be provided to the electric junction box, and a plurality of connectors may be connected thereto. Further, the connector fitted to the connector fitting portion is not limited to the SRS connector, but may instead be any suitable connector. Furthermore, a position of the connector connection portion is not limited to the middle portion of the box main body, but may instead be at any suitable position, and the projected portion 28 in the embodiment above is not necessarily required.

Further, the fitting peripheral wall does not need to have a constant height along the entire periphery. For instance, the fitting peripheral wall may be provided to the entire periphery continuously only in the projected base end portion. Further, the reinforcement rib 58 in the embodiment above is not necessarily required.

Furthermore, the windows for mounting components provided to the retainer are not necessarily required. The electrical component connection portion of the vertical bus bars may be provided in an electrical compartment mount portion provided off of the retainer, for instance. In addition, the pressing projection of the retainer is not necessarily required. When the pressing projection is provided, the pressing projection may press an entire portion off of the electric component connection portion of the vertical bus bars, or a part of the portion.

Figure 9:
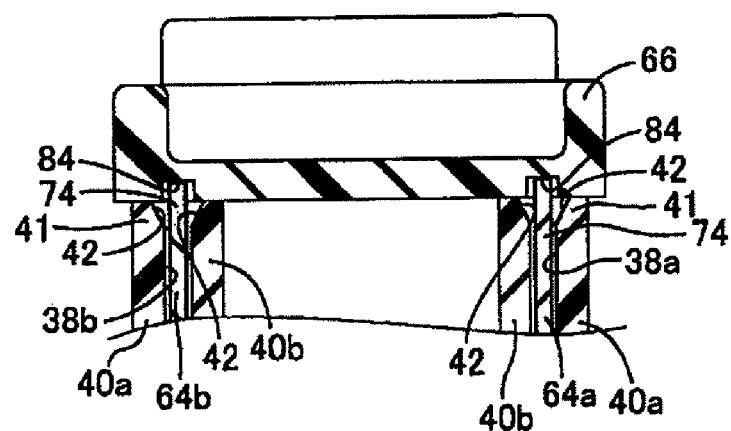
FIG. 9 is a cross-sectional view illustrating a different embodiment of the present invention.

As shown in FIG. 9, for example, holding grooves 84 may be provided to the retainer 66 in positions overlapping the bus bar insertion grooves 38a and 38b, the holding grooves 84 having a groove width substantially the same as the bus bar insertion grooves 38a and 38b and being open thereto. Then, the end portions of the vertical bus bars 64a and 64b on the front surface 20 side may be inserted to the holding grooves 84. Thereby, instability of the vertical bus bars 64a and 64b can be prevented.

It is noted that the foregoing examples have been provided merely for the purpose of explanation and are in no way to be construed as limiting of the present invention. While the present invention has been described with reference to exemplary embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular structures, materials and embodiments, the present invention is not intended to be limited to the particulars disclosed herein; rather, the present invention extends to all functionally equivalent structures, methods and uses, such as are within the scope of the appended claims.

The present invention is not limited to the above described embodiments, and various variations and modifications may be possible without departing from the scope of the present invention.

What is claimed is:

1. An electric junction box in which an electrical component is mounted to a first surface of a box main body and a connector fitting portion is provided open to a second surface of the box main body, the electric junction box comprising:
   a vertical bus bar mounted from the first surface of the box main body;
   a connection terminal integrally formed with the vertical bus bar, the connection terminal being disposed in the connector fitting portion, penetrating the box main body;
   an electrical component connection portion integrally formed with the vertical bus bar on a side of the first surface of the box main body, and
   a retainer configured to hold the vertical bus bar fixedly to the first surface of the box main body, such that the retainer does not contact the electrical component connection portion.

2. The electric junction box according to claim 1, wherein
   a bus bar insertion groove is provided open to the first surface of the box main body; the vertical bus bar being inserted in and assembled to the bus bar insertion groove;
   a tapered surface widening externally is provided to an opening portion of walls constituting the bus bar insertion groove; the opening portion of the walls constituting the bus bar insertion groove being closed by the retainer; and
   the retainer includes a pressing projection that enters the bus bar insertion groove from the tapered surface in the opening portion, and overlaps an end surface of the vertical bus bar.

3. The electric junction box according to claim 2, wherein the retainer includes a window for mounting the electrical component; and the electrical component connection portion is positioned in the window for mounting.

4. The electric junction box according to claim 3, wherein the vertical bus bar includes a contact portion which contacts the retainer on a side opposite to the connection terminal in a vertical direction of the vertical bus bar, the contact portion preventing displacement in a disengagement direction from the box main body.

5. The electric junction box according to claim 2, wherein the vertical bus bar includes a contact portion which contacts the retainer on a side opposite to the connection terminal in a vertical direction of the vertical bus bar, the contact portion preventing displacement in a disengagement direction from the box main body.

6. The electric junction box according to claim 1, wherein the retainer includes a window for mounting the electrical component; and the electrical component connection portion is positioned in the window for mounting.

7. The electric junction box according to claim 6, wherein the vertical bus bar includes a contact portion which contacts the retainer on a side opposite to the connection terminal in a vertical direction of the vertical bus bar, the contact portion preventing displacement in a disengagement direction from the box main body.

8. The electric junction box according to claim 1, wherein the vertical bus bar includes a contact portion which contacts the retainer on a side opposite to the connection terminal in a vertical direction of the vertical bus bar, the contact portion preventing displacement in a disengagement direction from the box main body.

* * * * *